(12) United States Patent
Rice (10) Patent No.: US 7,145,927 B2
(45) Date of Patent: *Dec. 5, 2006

(54) LASER DIODE ARRAYS WITH REPLACEABLE LASER DIODE BARS AND METHODS OF REMOVING AND REPLACING LASER DIODE BARS

(75) Inventor: Robert Rex Rice, Simi Valley, CA (US)

(73) Assignee: The Boeing Company, Seattle, WA (US)

( * ) Notice: Subject to any disclaimer, the term of this patent is extended or adjusted under 35 U.S.C. 154(b) by 142 days.

This patent is subject to a terminal disclaimer.

(21) Appl. No.: 10/784,518

(22) Filed: Feb. 23, 2004

(65) Prior Publication Data

US 2004/0165628 A1 Aug. 26, 2004

Related U.S. Application Data

(63) Continuation of application No. 10/242,055, filed on Sep. 12, 2002, now Pat. No. 6,724,792.

(51) Int. Cl.
*H01S 3/00* (2006.01)
*H01S 3/04* (2006.01)
(52) U.S. Cl. .............................. 372/36; 372/34; 372/35
(58) Field of Classification Search ............. 372/34–36
See application file for complete search history.

(56) References Cited

U.S. PATENT DOCUMENTS

| 5,105,429 A | | 4/1992 | Mundinger et al. | |
|---|---|---|---|---|
| 5,305,344 A | * | 4/1994 | Patel | 372/50.12 |
| 5,495,490 A | * | 2/1996 | Rice et al. | 372/34 |
| 5,848,083 A | | 12/1998 | Haden et al. | |
| 6,151,341 A | | 11/2000 | Bull et al. | |
| 6,266,881 B1 | | 7/2001 | Takigawa et al. | |
| 6,295,307 B1 | * | 9/2001 | Hoden et al. | 372/36 |
| 6,352,873 B1 | * | 3/2002 | Hoden | 438/28 |

* cited by examiner

*Primary Examiner*—Dong Wong
*Assistant Examiner*—Hung Tran Vy
(74) *Attorney, Agent, or Firm*—Alston & Bird LLP (57) ABSTRACT

The laser diode arrays with removable linear laser diode bars and the methods of removing and replacing linear laser diode bars of the present invention provide easy and immediate removal of individual linear laser diode bars in laser diode arrays. The laser diode array is at least partially made of a plurality of removable linear laser diode bars and a plurality of spacers, such that each removable linear laser diode bar is disposed between a respective pair of spacers. A linear laser diode bar may be slideably removed from between the respective pair of spacers in the laser diode array without breaking any mechanical connection between the removable linear laser diode bar and the respective pair of spacers. A replacement linear laser diode bar may then be slideably inserted between the respective pair of spacers without forming a mechanical connection between the replacement linear laser diode bar and the spacers.

5 Claims, 3 Drawing Sheets

LASER DIODE ARRAYS WITH REPLACEABLE LASER DIODE BARS AND METHODS OF REMOVING AND REPLACING LASER DIODE BARS

CROSS REFERENCE TO RELATED APPLICATIONS

This application is a continuation of U.S. application Ser. No. 10/242,055, filed Sep. 12, 2002 now U.S. Pat. No. 6,724,792, which is hereby incorporated herein in its entirety by reference.

BACKGROUND OF THE INVENTION

This invention is related to semiconductor laser devices and, more particularly to semiconductor laser devices with replaceable laser diode bars.

A number of lasers, such as slab and rod lasers, are designed to produce output pulses having a high average output power, such as 1,000 W–10,000 W, operating either continuously or in a repetitively pulsed mode. High levels of output power are required in a number of applications including laser radar, mine detection, welding, material processing, surface coating, isotope separation and x-ray lithography, among others. In order to obtain such high power levels, a primary laser, such as a slab or a rod laser, can be pumped by a laser pump source, such as an array of semiconductor laser diodes. The laser pump source must also operate at relatively high power levels and either at relatively high pulse repetition rates or continuously in order to generate the necessary power to excite the primary laser.

Semiconductor lasers that pump a primary laser are typically made of multiple linear arrays of laser diodes, also known as linear laser diode bars. The linear laser diode bars are then arranged in a two-dimensional laser diode array. To form the two-dimensional laser diode array, the linear laser diode bars are typically soldered on microchannel heat sinks, which are subsequently stacked. The two-dimensional laser diode array is capable of generating high intensity light for pumping the primary laser.

Although the soldered two-dimensional laser diode array design is suitable for laser applications, it creates significant difficulty when individual linear laser diode bars must be replaced. The linear laser diode bars occasionally fail for a variety of reasons, such as facet erosion (also called "spewing"), solder bonding failure, overheating, dark line defect growth, and gradual degradation, and must be replaced. Because the linear laser diode bars are soldered on heat sinks, however, the bars cannot be easily removed and reinserted. Instead, the entire two-dimensional laser diode array must either be scrapped or, if a repair is to be attempted, the entire array typically must be disassembled by breaking the solder joints, if possible, replacing the failed bar, and reassembling the array by resoldering the new laser diode bar into position, then resoldering the array together. Because of the difficulty involved in breaking the solder joints and resoldering the array, the replacement of conventional linear laser diode bars cannot be performed by a typical user of a semiconductor laser device. In fact, the replacement process typically cannot even occur at or near the location at which the semiconductor laser device is deployed. Instead, the semiconductor laser device should be returned to its manufacturer or a maintenance depot for repair, which can take weeks. Thus, the semiconductor laser device is inoperable and unavailable during the time it is being repaired and during the time it is in transit to and from the manufacturer.

Replacing a linear laser diode bar in a two-dimensional laser diode array, therefore, can be costly to users of the semiconductor laser devices who must be without the device for weeks while it is being repaired. In addition, it is costly and labor-intensive for the manufacturers of such semiconductor laser devices or for other maintenance personnel to make the repairs necessary when a linear laser diode bar must be replaced. As such, there is a need in the industry to provide a two-dimensional laser diode array for use in semiconductor laser devices, in which the individual linear laser diode bars may be easily and immediately replaced without having to disassemble the entire array and without a significant investment of time and/or money.

Thermal heat dissipation is another concern for semiconductor lasers. In this regard, in generating pulses having a relatively high average output power and a relatively high repetition rate, the laser pump source generates a significant amount of heat, which elevates the temperature of the laser pump source in the absence of external cooling. For example, the heat generated by a laser can be approximated by the difference between the power input to the laser and the output power received from the laser. Typically, the heat generated by a conventional laser pump source is approximately 45%–60% of the input power, with the overall efficiency of a solid state laser comprised of a laser pump source and a downstream laser system being about 10%–20%.

Lasers, such as semiconductor laser diode arrays, however, typically have a maximum operating temperature above which the operation of the laser can be unreliable. In addition, operation of a laser, such as a semiconductor laser diode array, at an elevated temperature generally reduces the effective lifetime of the laser even though such temperatures may be below the maximum operating temperature. For example, operation of a semiconductor laser diode array at an elevated temperature can damage the emitting facet of the laser diode array, thereby impairing its performance.

One type of semiconductor laser diode array that provides suitable cooling during laser operation, while also being economical to produce compared to other semiconductor laser diode arrays, is the immersion cooled array. An immersion cooled array is made from linear laser diode bars mounted on microchannel coolers. The simple linear laser diode bars are capable of continuous wave (CW) or high duty factor operation by clamping the bars to liquid cooled heat sinks, and immersing the entire two-dimensional laser diode array in a flowing dielectric coolant. Details of the immersion cooled array are included in U.S. Pat. No. 5,495,490, which is incorporated herein by reference.

Because of the time and expense involved in replacing individual linear laser diode bars in conventional laser diode arrays, it would be advantageous to be able to quickly and easily replace individual linear laser diode bars in laser diode arrays. In particular, there is a need in the industry to utilize two-dimensional laser diode arrays, such as immersion cooled arrays, in semiconductor laser diode devices, in which the arrays include individual linear laser diode bars that are easily and immediately replaceable without a significant investment of time and/or money. Furthermore, due to the efficient and economical nature of the immersion cooled array, it would be desirable to be able to utilize such an immersion cooled two-dimensional laser diode array made from removable linear laser diode bars in a variety of applications.

BRIEF SUMMARY OF THE INVENTION

The laser diode arrays with removable linear laser diode bars and the methods of removing and replacing linear laser diode bars of the present invention provide easy and immediate removal of individual linear laser diode bars in laser diode arrays. Therefore, the individual linear laser diode bars may be removed and replaced in the field without having to transport the laser diode array to a maintenance depot or the like, which significantly reduces the time and labor involved in the removal and replacement, as compared to conventional removal and replacement techniques. In addition, the removable linear laser diode bars may be utilized with various types of laser diode arrays, including efficient and economical immersion cooled laser diode arrays.

One embodiment of the method for removing at least one of a plurality of removable linear laser diode bars from a laser diode array includes accessing a removable linear laser diode bar within the laser diode array and slideably removing the removable linear laser diode bar, such as upon failure of the linear laser diode bar. The laser diode array is at least partially made of the plurality of removable linear laser diode bars and a plurality of spacers, such that each removable linear laser diode bar is disposed between a respective pair of spacers. As such, when the removable linear laser diode bar is slideably removed from the laser diode array, it is slideably removed from between the respective pair of spacers in the laser diode array. In addition, the removable linear laser diode bar is slideably removed without breaking any mechanical connection between the removable linear laser diode bar and the respective pair of spacers.

To slideably remove the removable linear laser diode bar from between the respective pair of spacers, a force may be applied to the removable linear laser diode bar in a direction away from the plurality of spacers. The force, therefore, overcomes the frictional force between the removable linear laser diode bar and the respective pair of spacers.

The laser diode array may be immersion cooled. The immersion cooled laser diode array includes a plurality of removable linear laser diode bars, a plurality of spacers, and a liquid coolant flowing about and through the immersion cooled laser diode array. As before, each removable linear laser diode bar is disposed between a pair of spacers. Replacing a removable linear laser diode bar includes at least partially draining the liquid coolant from the immersion cooled laser diode array. The removable linear laser diode bar is then accessed, which may involve opening a housing in which the removable linear laser diode bars are disposed. The removable linear laser diode bar is slideably removed from between the respective pair of spacers in the array, and a replacement linear laser diode bar is slideably inserted between the respective pair of spacers.

Slideably removing the respective removable linear laser diode bar may involve removing the bar without breaking a mechanical connection between the respective removable linear laser diode bar and the respective pair of spacers. Likewise, slideably inserting the replacement linear laser diode bar may involve positioning the replacement linear laser diode bar between the respective pair of spacers without forming a mechanical connection between the replacement linear laser diode bar and the respective pair of spacers. For example, in one embodiment of the present invention, the replacement linear laser diode bar is secured between the respective pair of spacers with frictional forces. After slideably inserting the replacement linear laser diode bar, a liquid coolant may be introduced about and through the laser diode array for immersion cooling.

In addition to the methods for removing and replacing linear laser diode bars in laser diode arrays, another aspect of the present invention also includes a laser diode assembly with such removable linear laser diode bars. The laser diode assembly comprises a two-dimensional laser diode array that includes a plurality of linear laser diode arrays, each of which has first and second major surfaces. First and second electrodes are electrically connected to the two-dimensional laser diode array for supplying the array with electrical energy, such that at least one of the linear laser diode arrays is capable of emitting a laser output from its emitting facet. At least one heat sink of a plurality of heatsinks is in thermal communication with each linear laser diode array to form a plurality of removable linear laser diode bars. The laser diode assembly also includes a plurality of spacers in a predetermined spaced apart relationship with one another. As such, each removable linear laser diode bar is slideably insertable and slideably removable between a respective pair of spacers. For instance, in one embodiment of the laser diode assembly of the present invention, the removable linear laser diode bar may be secured between the respective pair of spacers with frictional forces.

The spacers may extend from a first end rearwardly to a second end and the laser diode assembly may also include an electrically insulating element to which the second end of each spacer is fixed in order to electrically isolate the spacers. In other embodiments, a plurality of electrically insulating sheets may be disposed between respective pairs of spacers to electrically isolate the spacers.

The two-dimensional laser diode array, the first and second electrodes, the plurality of heat sinks, and the plurality of spacers may be disposed in a housing. A window may be located in the front surface of the housing, such that the respective emitting facets of the plurality of linear laser diode arrays are positioned adjacent the window. In this embodiment of the laser diode assembly of the present invention, the laser diode array may be immersion cooled by positioning the plurality of linear laser diode arrays adjacent the window in a predetermined spaced apart relationship such that liquid coolant flows between the window and the linear laser diode arrays. The housing also may define inlet and outlet ports through which the liquid coolant flows into and out of the housing.

The heat sinks may extend rearwardly from the plurality of linear laser diode arrays, and first channels may be defined between the rearwardly extending heat sinks. The first channels can, therefore, receive the liquid coolant such that the liquid coolant directly contacts and cools the linear laser diode arrays by immersion while maintaining electrical isolation between the first and second electrodes. The first channels may be further defined by disposing a first end of each heat sink on one of the first and second major surfaces of a linear laser diode array. Each heat sink may extend rearwardly to a second end, and electrically insulating members may be disposed between the respective second ends of a pair of heat sinks of each removable linear laser diode bar, which further defines the first channels between the pair of heat sinks, the electrically insulating members and the linear laser diode arrays.

Additionally, second channels may be defined between the removable linear laser diode bars that extend forwardly from the plurality of electrically isolated spacers, when the removable linear laser diode bars are inserted between respective pairs of spacers. The second channels can also receive liquid coolant such that the liquid coolant directly contacts and cools the removable linear laser diode bars by immersion while maintaining electrical isolation between the first and second electrodes.

In a further embodiment of the laser diode assembly of the present invention, the two-dimensional laser diode array, the first and second electrodes, the heat sinks, and the spacers are disposed in the housing, and a solid state laser is disposed in an opening in the front surface of the housing. Thus, the two-dimensional laser diode array is disposed within the housing such that the respective emitting facets of the laser diode arrays are positioned adjacent the solid state laser in a predetermined spaced apart and aligned relationship, such that the laser diode array pumps the solid state laser. The laser diode array of this embodiment may be immersion cooled by positioning the linear laser diode arrays adjacent the solid state laser such that liquid coolant flows between the solid state laser and the linear laser diode arrays, which cools both the solid state laser and the linear laser diode arrays.

The laser diode assembly with removable linear laser diode bars and the methods of removing and replacing linear laser diode bars of the present invention provide easy and immediate removal of individual linear laser diode bars in laser diode arrays. As such, the cost and labor involved in removing and replacing individual linear laser diode bars is significantly reduced, as compared to conventional techniques. In addition, the laser diode assembly of the present invention functions at least as well and at least as efficiently as conventional laser diode arrays, particularly in instances in which the laser diode assembly of the present invention is immersion cooled.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 1:
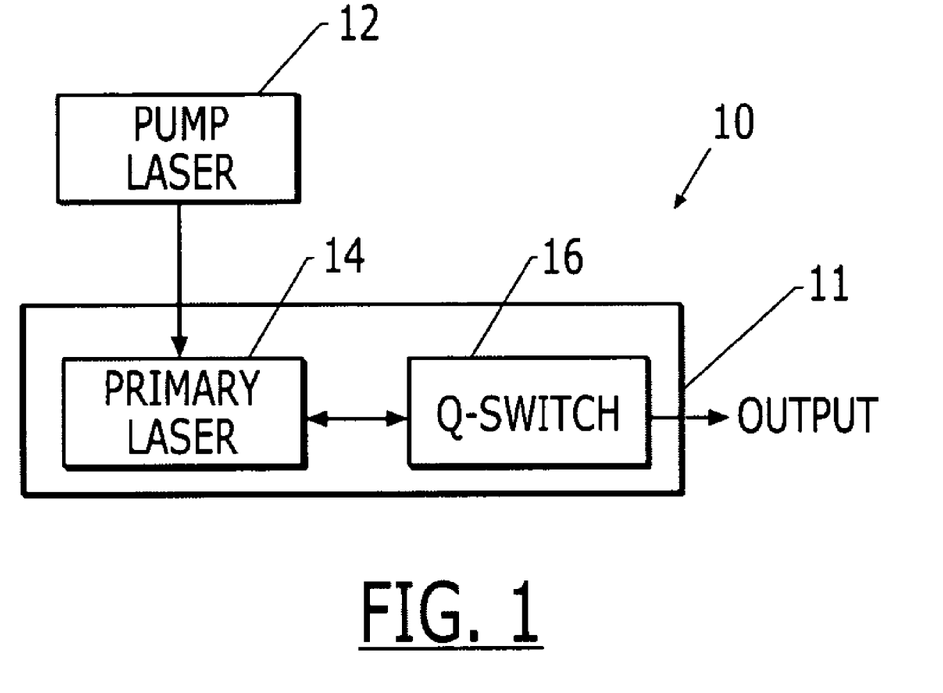
FIG. 1 is a block diagram of a laser system according to one embodiment of the present invention, that illustrates the relationship of a laser pump source, a primary laser and a Q-switch.

Referring now to FIG. 1, a laser system 10 which is adapted to provide a laser output having a relatively high output power level is illustrated in block diagram form. In particular, the laser system includes a laser pump source 12 for emitting laser output pulses. The output pulses are preferably produced at a relatively high repetition rate and have a relatively high average power level. For example, the laser pump source can be a two-dimensional laser diode array, which produces pulses having an average power level of 100–1000 W/cm$^2$ at an average repetition rate of 100–1000 Hz.

The output pulses emitted by the laser pump source 12 may be applied to a primary laser 14, such as a slab or rod laser. For example, the primary laser can be a Nd:YAG slab laser. The output of the primary laser can, in turn, be controlled by a Q-switch 16. As known to those skilled in the art, the Q-switch induces the primary laser to emit short pulses with high peak power as shown in FIG. 1. Alternatively, in embodiments in which the laser system 10 does not include a Q-switch, the primary laser will generally operate in either a continuous wave (CW) or a long pulse mode. If included, the Q-switch defines, at least in part, the primary laser cavity 11 and controls the output of the primary laser such that only output pulses having a power level above a predetermined threshold level are generated. For example, a Q-switched Nd:YAG laser generally produces output pulses having an average power level of 10 W to more than 1000 W at an average pulse repetition rate of 1000 Hz or greater.

Figure 2:
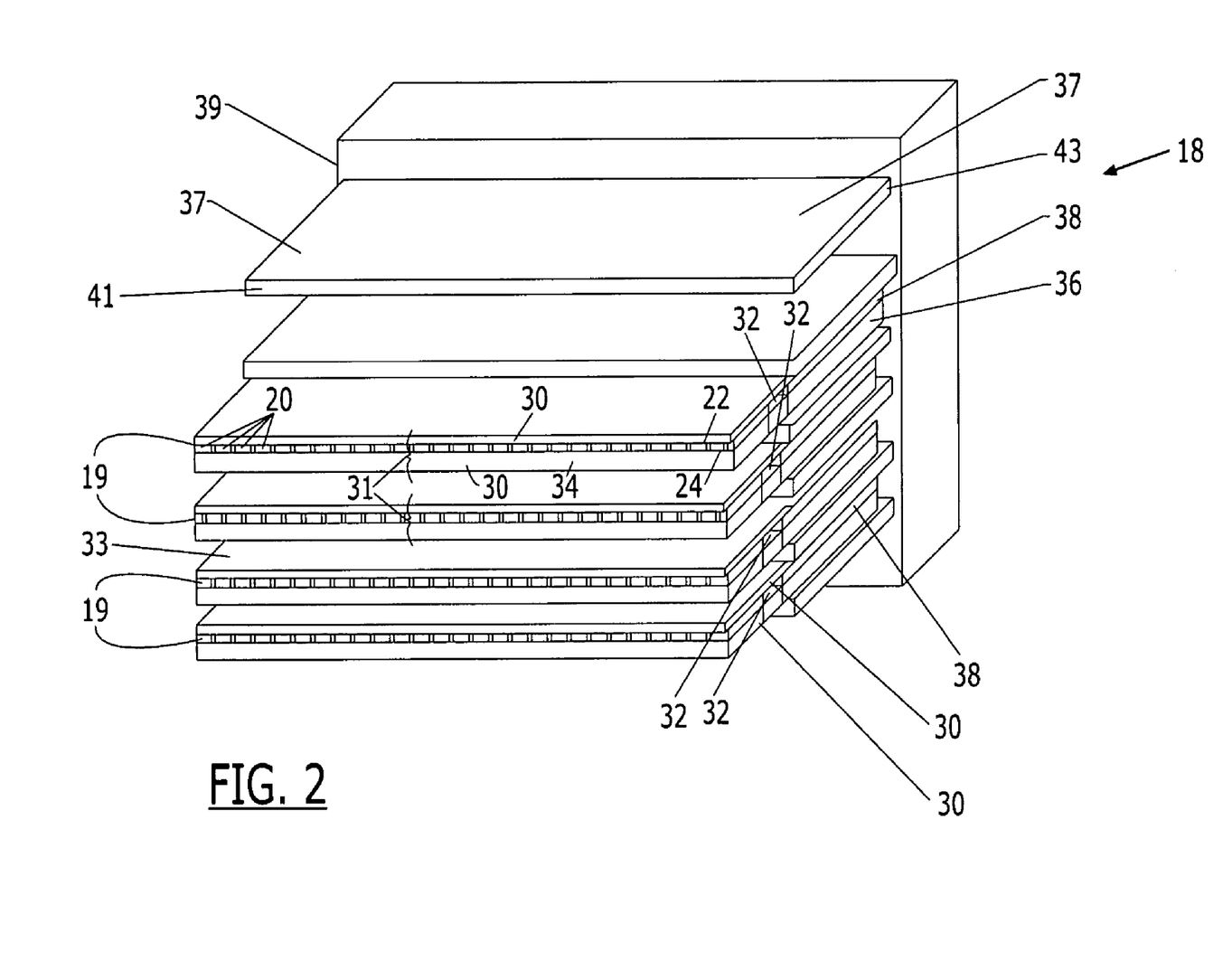
FIG. 2 is a perspective view of a semiconductor laser diode assembly with removable linear laser diode bars, according to one embodiment of the present invention.
Figure 3:
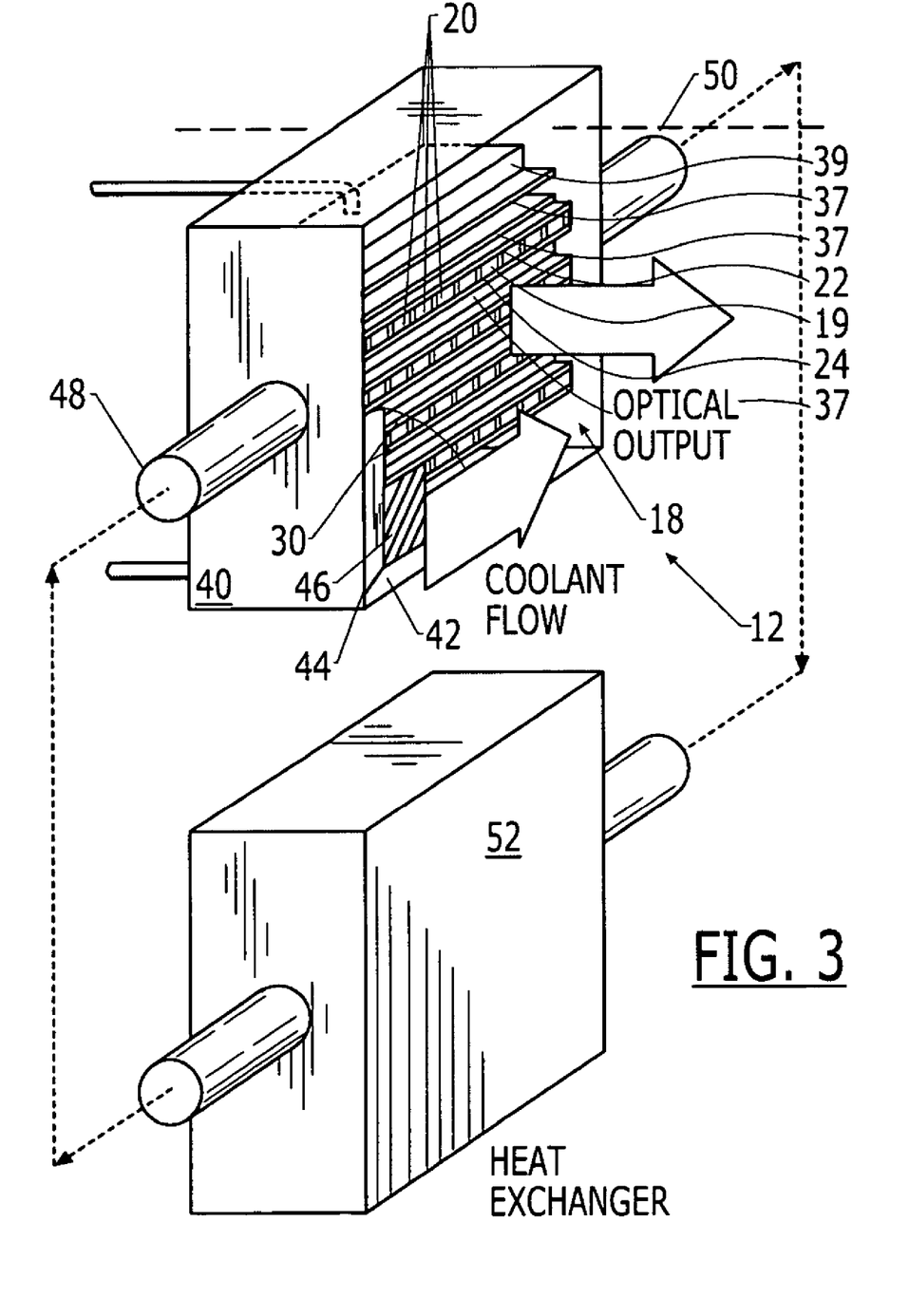
FIG. 3 is a perspective view of a semiconductor laser diode device according to one embodiment of the present invention, with portions of the housing and window removed to illustrate the internal components thereof.

According to the present invention, the laser pump source 12 is a semiconductor laser assembly including a semiconductor laser device 18. In one preferred embodiment, the semiconductor laser device includes a plurality of linear laser diode arrays 19 configured as a two-dimensional laser diode array. For example, one embodiment of the semiconductor laser device of the present invention includes a two-dimensional laser diode array, and is illustrated in FIGS. 2 and 3. As known to those skilled in the art, the individual laser diodes or emitters 20 of the semiconductor laser device are preferably electrically connected such that the output of the laser diode array is synchronized. In addition, it will be apparent to one skilled in the art that the lines of FIGS. 2 and 3 that separate the individual emitters are for purposes of illustration and form no material portion of the known laser diode array.

The plurality of linear laser diode arrays 19 that comprise the semiconductor laser device 18 can be fabricated of any of the semiconducting materials known to those skilled in the art. For example, the plurality of linear laser diodes can be comprised of AlGaAs, InGaAs, or GaInAsP. The plurality of linear laser diodes can be comprised of other materials known to those skilled in the art, however, without departing from the spirit and scope of the present invention. In addition, each linear laser diode array can include a plurality of individual emitters 20, such as between sixteen and thirty emitters in one exemplary embodiment.

As further illustrated in FIGS. 2 and 3, the semiconductor laser device 18 can also include a plurality of heat sinks 30. Typically, the heat sinks are comprised of a material having relatively high thermal conductivity. In addition, the heat sinks are preferably electrically conductive so as to electrically connect the plurality of linear laser diode arrays 19. Thus, the plurality of heat sinks can be comprised of copper or copper alloys, gold, silver or other known materials that are both electrically and thermally conductive.

A heat sink is preferably in thermal communication with each linear laser diode array. In this regard, each linear laser diode array preferably has first and second opposed major surfaces 22 and 24, respectively. As shown in FIGS. 2 and 3, a heat sink 30 may be disposed on each first and second major surface 22 and 24 to create a plurality of removable linear laser diode bars 31. One embodiment of removable linear laser diode bars 31 is shown in FIG. 2. To form a linear laser diode bar, a linear laser diode array 19 may be soldered between a pair of heat sinks 30. In other embodiments of the linear laser diode bars 31, any type of anode and cathode surfaces known to those skilled in the art, and having an appropriate thickness, may be disposed on each first and second major surface 22 and 24 of the linear laser diode arrays 19. The heat sinks disposed on the first and second major surfaces 22 and 24 may be the same size and shape, and may be made of the same thermally and electrically conductive material. Alternatively, at least one of the heat sinks 30 disposed on one of the first and second major surfaces 22 and 24 of the linear laser diode arrays 19 may have a different size, shape, and/or made of a different thermally and electrically conductive material than the heat sink disposed on the other of the first and second major surfaces. The plurality of heat sinks 30 also electrically connect each of the plurality of linear laser diode arrays 19. The plurality of heat sinks may extend rearwardly from the two-dimensional laser diode array to define a plurality of first channels 32 between each pair of rearwardly extending heat sinks and the linear laser diode array 19 disposed between the pair of heat sinks. In the embodiment illustrated in FIG. 2, each heat sink extends from a first end 34 disposed on a linear laser diode array rearwardly to an opposed second end 36.

In some embodiments of the semiconductor laser device 18 of the present invention, a plurality of electrically insulating members 38 may electrically isolate each pair of heat sinks 30 disposed on the linear laser diode arrays 19. The plurality of electrically insulating members 38 are typically comprised of an insulating material, such as Beryllium Oxide (BeO), a dielectric and/or a plastic material. At least one member may be disposed between the respective second ends 36 of each pair of heat sinks 30 to further define a first channel 32. In particular, each first channel of this embodiment may be defined between a pair of heat sinks, an electrically insulating member disposed between the pair of heat sinks and a linear laser diode array 19 also disposed between the pair of heat sinks.

A plurality of spacers 37 may also be included in the semiconductor laser device 18 of the present invention. The spacers 37, like the heat sinks 30, may be comprised of a material having relatively high thermal conductivity. In addition, the spacers 37 are preferably electrically conductive so as to electrically connect the plurality of linear laser diode bars 31. Thus, the plurality of spacers can be comprised of copper or copper alloys, gold, silver or other known materials that are both electrically and thermally conductive.

The spacers 37 are positioned in a predetermined spaced apart relationship with one another, such that each removable linear laser diode bar 31, formed of a combination of a linear laser diode array, sandwiched between a pair of heat sinks in one embodiment, is slideably insertable and slideably removable between a respective pair of spacers. In a preferred embodiment of the present invention, the spacers 37 are mounted to and extended outwardly from an electrically insulating element 39, typically comprised of an insulating material, such as Beryllium Oxide (BeO), a dielectric and/or a plastic material, to electrically isolate the spacers. The spacers 37 may extend from a first end 41 to a second end 43, such that the second end of each spacer is fixed to the electrically insulating element 39. The spacers 37 may be mounted to the electrically insulating element 39 in any manner known to those skilled in the art. For instance, the spacers 37 may be mounted to the electrically insulating element 39 by casting the second end of the spacers within a dielectric block that forms the electrically insulating element.

In other embodiments of the present invention, the spacers 37 are electrically isolated by disposing a plurality of electrically insulating sheets between the respective pairs of spacers 37. For example, electrically insulating sheets may be disposed on each of the major surfaces of the spacers 37, such that the sheets are located between the spacers and the heat sinks 30. The spacers may be electrically isolated in any other manner known to those skilled in the art.

As stated above, the linear laser diode bars 31, typically in combination with the respective heat sinks, are slideably insertable and slideably removable between a respective pair of spacers. A linear laser diode bar 31, therefore, may be removed from between the respective pair of spacers without breaking a mechanical connection between the linear laser diode bar and the respective pair of spacers. As such, the linear laser diode bars may be secured between the respective pairs of spacers without creating a mechanical connection between the linear laser diode bars and the respective pairs of spacers by any manner known to those skilled in the art. For instance, a linear laser diode bar 31 may be removably secured between a respective pair of spacers with frictional forces. In this embodiment, a force may be applied to the linear laser diode bar in a direction away from the plurality of spacers, such as in a direction away from the electrically insulating element 39 in the embodiment of FIG. 2, in order to slideably remove a linear laser diode bar 31 from the laser diode array. The force applied to the linear laser diode bar is, therefore, enough to overcome the frictional force securing the linear laser diode bar between the respective pair of spacers.

After removing a linear laser diode bar 31 from between a respective pair of spacers, a replacement linear laser diode bar may be inserted between the respective pair of spacers. The linear laser diode bars may be inserted and/or removed in any manner known to those skilled in the art. For instance, the linear laser diode bars may be inserted and/or removed via manual means, such as by hand or with a manually controlled tool, or via electromechanical means, such as a mechanism that is controlled by electrical signals originating from a computer processor.

The laser diode assembly with removable linear laser diode bars 31 of the present invention, therefore, permits easy and immediate removal and replacement of individual linear laser diode bars. As such, the cost and labor involved in removing and replacing individual linear laser diode bars is significantly reduced as compared to conventional techniques. By simplifying the replacement procedure, at least some repairs may advantageously be performed in the field, thereby avoiding having to ship the laser array assembly to a maintenance depot and incurring the delays associated therewith. In addition, the laser diode assembly of the present invention function at least as well and at least as efficiently as conventional laser diode arrays.

As also illustrated in FIG. 3, the semiconductor laser device 18 of the present invention is electrically activated. Thus, the semiconductor laser device preferably includes first and second electrodes, electrically connected to the semiconductor laser device, for supplying electrical energy to the semiconductor laser device. Upon sufficient electrical actuation, the individual emitters 20 of the semiconductor laser device emit a laser output through an emitting or front facet of the semiconductor laser device and, more particularly, through the respective emitting or front facets of the individual emitters 20. Typically, the laser output is a series of pulses having a relatively high repetition rate, though CW operation may also be desirable. The first and second electrodes may be separate components attached to the semiconductor laser device to supply electrical energy to the semiconductor laser device. Alternatively, the outermost spacers 37 may serve as the first and second electrodes for receiving the electrical input.

During the emission of the laser output, the semiconductor laser device 18 generates heat, which increases the temperature of the semiconductor laser device in the absence of cooling. In order to maintain the semiconductor laser device at a temperature safely below a predetermined maximum operating temperature and, consequently, to prevent damage to the laser device, the semiconductor laser device is cooled. In this regard, the laser diode assembly of the present invention may be cooled in any manner known to those skilled in the art. In a preferred embodiment of the present invention, the laser diode assembly is cooled by immersion. A method and apparatus for immersion cooling of a semiconductor laser device is described in U.S. Pat. No. 5,495,490, the contents of which are incorporated herein by reference.

In the immersion cooling embodiment of the present invention, liquid coolant circulates about the electrically activated semiconductor laser device 18. More preferably, the liquid coolant flows about and directly contacts the emitting facet of the semiconductor laser device. The liquid coolant has a temperature less than the temperature of the semiconductor laser device during the emission of the laser output. Accordingly, the circulation of liquid coolant about the semiconductor laser device draws heat from and, consequently, cools the laser device.

The liquid coolant is preferably a dielectric liquid, which is both electrically and optically passive. Accordingly, the liquid coolant is transparent at the predetermined range of wavelengths at which the semiconductor laser device 18 emits a laser output. In addition, the liquid coolant does not absorb the laser emissions within the predetermined range of wavelengths such that the output power level produced by the semiconductor laser device is not attenuated or diminished by the circulating liquid coolant. In one embodiment, the dielectric liquid coolant is a fluorinert compound, such as FC75 or FC77. In another embodiment, the dielectric liquid coolant is a light hydrocarbon compound, such as hexane. In yet another embodiment, the dielectric liquid coolant is freon, anhydrous ammonia, a silicon-based liquid, deionized water, or a water and glycol mixture.

By directly contacting the semiconductor laser device 18 and, more particularly, by directly contacting the emitting facet of the semiconductor laser device, the thermal impedance of the semiconductor laser assembly 12 is reduced. In addition, the direct contact of the liquid coolant with the individual emitters 20 of the linear laser diodes of the semiconductor laser device provides for increased or enhanced cooling of the emitting facets such that the semiconductor laser device can be operated at relatively high temperatures without damaging the emitting facets of the linear laser diodes. Accordingly, the operating lifetime of the semiconductor laser device is prolonged. Further, the immersion of the semiconductor laser device and, in particular, the immersion of the emitting facet of the semiconductor laser device in the liquid coolant significantly reduces the risk that the emitting facet of the semiconductor laser device is exposed to external contamination.

In operation, liquid coolant flows through the plurality of first channels 32 defined by the rearwardly extending heat sinks 30 to contact and cool the plurality of linear laser diode arrays 19 by drawing heat from the heat sinks. Since the coolant is a dielectric liquid, however, the coolant maintains the electrical isolation between the first and second electrodes.

When more than one linear laser diode bar 31 is inserted between respective pairs of spacers 30 in the laser diode array 18 of the present invention, the linear laser diode bars may advantageously extend forwardly from the spacers to define second channels 33 between the forwardly extending linear laser diode bars, as shown in FIG. 2. In operation, liquid coolant also may flow through the plurality of second channels 33 defined by the forwardly extending linear laser diode bars 31 to further contact and cool the plurality of linear laser diode arrays 19 by drawing heat from the heat sinks.

The semiconductor laser assembly 12 of the present invention also preferably includes a housing 40 in which the semiconductor laser device 18 is disposed. As shown in a partial fragmentary perspective view in FIG. 3, the housing has a front surface 42 defining an opening 44 therein. The laser output of the semiconductor laser device is preferably emitted through the opening defined in the first surface of the housing. According to a first embodiment, a window 46 is disposed in the opening in the front surface of the housing. Preferably, the window is comprised of material, which is transparent to the laser output within the range of wavelengths which the semiconductor laser device emits. For example, the window can be comprised of glass, fused silicon, or sapphire. However, the window can be comprised of other materials without departing from the spirit and scope of the present invention.

The semiconductor laser device 18 is preferably disposed within the housing 40 such that the emitting facet of the semiconductor laser device is positioned adjacent the window 46 in a predetermined spaced apart relationship. As shown in FIG. 3, liquid coolant circulates between the window and the semiconductor laser device, through the heat sink 30, and, in addition, between the window and the individual emitters 20 of the linear laser diodes of the semiconductor laser device to thereby draw heat from and cool the semiconductor laser device.

In another embodiment, the primary laser 14, such as a solid state laser, is disposed within the opening 44 defined in the front surface 42 of the housing 40. As described above, the semiconductor laser device 18 is disposed within the housing such that the emitting facet of the laser device is positioned adjacent to the solid state laser in a spaced apart and aligned relationship. Thus, the semiconductor laser device pumps the solid state laser. In addition, the liquid coolant circulates between the solid state laser and the semiconductor laser device to thereby draw heat from and cool both the solid state laser and the semiconductor laser device.

As illustrated in FIG. 3, the housing 40 also preferably includes an inlet port 48 and an outlet port 50 through which the liquid coolant flows. As also illustrated schematically in FIG. 3, the semiconductor laser assembly can include a heat exchange means, such as an external cooler or chiller 52. For example, the external cooler can be a radiator or other type of heat exchanger. In one embodiment, the external cooler is self-sustaining, that is, the external cooler supports fluid flow in only one direction. The external cooler of this embodiment generally includes a series of valves, which only permit fluid flow in the one predetermined direction.

In operation, the liquid coolant enters the semiconductor laser assembly 12 through the inlet port 48 defined in the housing 40, flows through a first channel 32 defined between a pair of adjacent heat sinks 30 and/or a second channel 33 defined between a pair of adjacent linear laser diode bars 31 inserted between a respective pair of spacers 37, and exits from the housing through an outlet port 50 defined in an opposed sidewall of the housing. While circulating through the first and/or second channels, the liquid coolant absorbs heat or energy from the semiconductor laser device 18 and the heat sinks 30, thereby cooling the semiconductor laser device. By absorbing heat from the semiconductor laser device, however, the temperature of the liquid coolant increases. Thus, upon exiting the housing through the outlet port, the liquid coolant preferably flows through the radiator or heat exchanger. Within the heat exchanger, liquid coolant discharges at least a portion of the heat, which it absorbed from the semiconductor laser device such that the resulting temperature of the liquid coolant decreases.

The inlet and outlet ports 48 and 50 of the illustrated embodiment are defined in the opposed sidewalls of the housing 40. However, the inlet and outlet ports can, instead, be defined through other walls of the housing without departing from the spirit and scope of the present invention. For example, in one embodiment, the semiconductor laser assembly 12 also includes coolant directing means for directing the flow of the liquid coolant in a direction perpendicular to the emitting facet of the semiconductor laser device 18. In this embodiment, the electrically insulating members 38 define fluid passageways therethrough such that liquid coolant introduced through an inlet port defined in a rear surface of the housing flows through the fluid passageway of a respective electrically insulating spacer and into a corresponding first channel 32 defined between adjacent heat sinks 30. By directing the flow of liquid coolant in a direction perpendicular to the emitting facet of the semiconductor laser device and, more particularly, perpendicular to the emitting facets of the laterally extending linear laser diode array 18, the temperature or energy level of the liquid coolant which contacts each individual emitter 20 of the linear array is the same, regardless of the lateral position of the respective laser diode. Thus, each individual emitter can be cooled equally.

In addition, the heat transfer from the heat sinks 30 of the semiconductor laser assembly 12 of the present invention to the liquid coolant flowing thereby can be further modified by controlling the type of coolant flow. For example, a highly turbulent or a relatively laminar smooth coolant flow can be created through the first and/or second channels 32, 33. In addition, the heat transfer can be further modified by controlling the length of the channels, that is, the distance between the rear surface of the linear laser diode array 19 and the electrically insulating spacers 38 for the first channel, or the distance between the spacers 37 and the front surface 42 of the housing. Thus, for a short channel, i.e., a channel having a length less than about 1–2 mm, in which liquid coolant circulates according to a laminar flow, the heat transfer depends more directly upon the thermal conductivity of the liquid coolant. However, for a long channel, i.e., a channel having a length greater than about 10 mm, in which liquid coolant circulates according to a laminar flow, the heat transfer depends more directly on the thickness of the heat sink and the thermal conductivity of the heat sink, and less directly upon the thermal conductivity of the liquid coolant.

Alternatively, a turbulent flow can be created within the respective channels 32, 33. A turbulent flow creates a greater dependence of the heat transfer on the density and flow velocity of the liquid coolant, and less dependence on the thermal conductivity of the liquid coolant. Thus, relatively dense coolants, which circulate rapidly in a turbulent manner will provide increased heat transfer.

According to the present invention, the direct contact of the liquid coolant with the individual emitters 20 of the semiconductor laser device 18 more efficiently cools the semiconductor laser device. The more efficient cooling is particularly effective for removing heat from laser diode pump arrays, which produce output pulses having a relatively high average power and a relatively high repetition rate. In addition, the dielectric liquid coolant is preferably both electrically and optically passive to maintain electrical isolation between the electrodes, which supply electrical energy to the semiconductor laser device without absorbing the laser output emitted by the semiconductor laser device.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for replacing at least one of a plurality of removable linear laser diode bars of a laser diode array, comprising:

accessing a removable linear laser diode bar within the laser diode array, wherein the laser diode array comprises the plurality of removable linear laser diode bars and a plurality of spacers with each removable linear laser diode bar being disposed between a respective pair of spacers;

slideably removing the removable linear laser diode bar from between the respective pair of spacers in the laser diode array without breaking a mechanical connection between the removable linear laser diode bar and the respective pair of spacers;

maintaining a predetermined spaced apart relationship between the respective pair of spacers to facilitate subsequent insertion of a replacement linear laser diode bar;

slidably inserting and securing the replacement linear laser diode bar between the respective pair of spacers without creation of a mechanical connection therebetween; and electrically activating the replacement linear laser diode bar while the replacement linear laser diode bar remains secured between the pair of spacers without the creation of a mechanical connection therebetween.

2. The method for replacing at least one removable linear laser diode bar according to claim 1, wherein accessing the removable linear laser diode bar comprises opening a housing in which the laser diode array is disposed prior to slideably removing the removable linear laser diode bar.

3. The method for replacing at least one removable linear laser diode bar according to claim 2, wherein the laser diode array is immersion cooled, and wherein the method further comprises at least partially draining a liquid coolant from the housing prior to opening the housing.

4. The method for replacing at least one removable linear laser diode bar according to claim 1, wherein slideably removing the removable linear laser diode bar from between the respective pair of spacers comprises applying a force to the removable linear laser bar in a direction away from the plurality of spacers.

5. The method for replacing at least one removable linear laser diode bar according to claim 4, wherein applying the force comprises overcoming a frictional force between the removable linear laser diode bar and the respective pair of spacers.

* * * * *